(12) United States Patent
Moon et al.

(10) Patent No.: US 9,124,226 B2
(45) Date of Patent: Sep. 1, 2015

(54) METHOD OF OUTPUTTING AUDIO SIGNAL AND AUDIO SIGNAL OUTPUT APPARATUS USING THE METHOD

(75) Inventors: Won-hyung Moon, Seoul (KR); Hae-kwang Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 657 days.

(21) Appl. No.: 13/362,484

(22) Filed: Jan. 31, 2012

(65) Prior Publication Data

US 2012/0195441 A1 Aug. 2, 2012

Related U.S. Application Data

(60) Provisional application No. 61/438,295, filed on Feb. 1, 2011.

(30) Foreign Application Priority Data

Jul. 26, 2011 (KR) .......................... 10-2011-0074117

(51) Int. Cl.
*H03G 5/00* (2006.01)
*H03G 3/00* (2006.01)
*H03F 1/32* (2006.01)
(Continued)

(52) U.S. Cl.
CPC ................. *H03F 1/327* (2013.01); *H03F 3/181* (2013.01); *H03F 3/217* (2013.01); *H03F 5/00* (2013.01)

(58) Field of Classification Search
CPC ............. H03F 1/26; H03F 1/32; H03F 1/327; H03F 3/181; H03F 3/217; H03F 5/00; H03F 2200/351; H03F 2200/372

USPC ........ 381/98, 120, 61, 119; 330/3, 5, 251, 10, 330/207 A
See application file for complete search history.

(56) References Cited

U.S. PATENT DOCUMENTS 5,343,159 A 8/1994 Butler
6,140,870 A * 10/2000 Cook ............................... 330/3
(Continued)

FOREIGN PATENT DOCUMENTS

CN 1469234 A 1/2004
JP 2008-42641 A 2/2008
(Continued)

OTHER PUBLICATIONS

Communication dated Sep. 28, 2012, issued by the Korean Intellectual Property Office in counterpart International Application No. PCT/KR2012/000722.
(Continued)

*Primary Examiner* — Xu Mei
(74) *Attorney, Agent, or Firm* — Sughrue Mion, PLLC (57) ABSTRACT

An audio signal output apparatus includes a modulation signal generator for generating a first modulation signal by pulse-modulating an input audio signal of one channel using a first carrier signal or a first sampling clock, which has a first frequency; a vacuum tube filter unit comprising a vacuum tube and for generating a vacuum tube signal by allowing the first modulation signal to pass through the vacuum tube; a frequency modulation unit for generating a second modulation signal by pulse-modulating the vacuum tube signal; and a power switching amplifier for outputting an amplification signal corresponding to the second modulation signal.

18 Claims, 9 Drawing Sheets

(51) Int. Cl.
*H03F 3/181* (2006.01)
*H03F 3/217* (2006.01)
*H03F 5/00* (2006.01)

(56) References Cited

U.S. PATENT DOCUMENTS

| | | | |
|---|---|---|---|
| 8,410,845 B2* | 4/2013 | Park | 330/10 |
| 2010/0013554 A1* | 1/2010 | Park | 330/10 |
| 2011/0043278 A1* | 2/2011 | Adams | 330/69 |
| 2012/0025847 A1* | 2/2012 | Andre | 324/612 |
| 2012/0237060 A1* | 9/2012 | Cho et al. | 381/121 |
| 2013/0094673 A1* | 4/2013 | Moon et al. | 381/120 |

FOREIGN PATENT DOCUMENTS

| | | |
|---|---|---|
| KR | 10-2006-0016519 A | 2/2006 |
| KR | 10-2010-0008749 A | 1/2010 |
| WO | 2010008226 A2 | 1/2010 |
| WO | 2010086348 A2 | 8/2010 |

OTHER PUBLICATIONS

Communication dated Jun. 1, 2015 issued by the State Intellectual Property Office of P.R. China in counterpart Chinese Patent Application No. 201280017326.4.

* cited by examiner

METHOD OF OUTPUTTING AUDIO SIGNAL AND AUDIO SIGNAL OUTPUT APPARATUS USING THE METHOD

CROSS-REFERENCE TO RELATED PATENT APPLICATION

This application claims the benefit of U.S. Provisional Patent Application No. 61/438,295, filed on Feb. 1, 2011, in the U.S. Patent and Trademark Office, and the benefit of Korean Patent Application No. 10-2011-0074117, filed on Jul. 26, 2011, in the Korean Intellectual Property Office, the disclosures of which are hereby incorporated herein by reference in their entireties.

BACKGROUND

1. Field

The exemplary embodiments relate to a method of outputting an audio signal and an audio signal output apparatus using the method, and more particularly, to a method of outputting an audio signal and an audio signal output apparatus using the method to improve sound quality of an audio signal and decrease noise and errors that may occur during a switching amplification operation.

2. Description of the Related Art

Examples of an audio power amplifier capable of receiving an audio signal and then outputting an acoustically-recognizable signal include a class-A amplifier, a class-B amplifier, a class-AB amplifier, and a class-D amplifier. Among these examples, the class-D amplifier is widely used because it can reduce a drop-off in amplification efficiency which may occur in the class-A amplifier, the class-B amplifier, the class-AB amplifier, and the like.

The class-D amplifier is a digital amplifier that modulates an analog audio signal into a digital audio signal, performs signal processing such as noise removal on the digitally-modulated audio signal, and amplifies the digitally-modulated audio signal. The digitally-modulated audio signal is amplified to a signal having a high voltage level. Here, the amplification is achieved using a switching amplifier, which receives power having a high voltage level and power having a low voltage level. Afterwards, the switching amplifier performs a switching operation according to an input digital signal, thereby outputting audio signals having a logic-high voltage level and a logic-low voltage level.

Although the digital amplifier has a high amplification efficiency, sound quality of the output audio signal is not smooth and tends to have a monotonous tone. Also, due to harmonic components which may occur in the digital amplifier, a negative distortion of sound may occur.

Also, when the switching operation is performed by the switching amplifier, switching noise occurs. The switching noise decreases a signal-to-noise ratio (SNR) of the switching amplifier. Power noise such as a ripple exists in power that is supplied to the switching amplifier. The power noise also decreases the SNR. In addition, a switching loss, falling of a switching driving signal, and a delay of a rising time, which occur during a switching amplification operation, cause a non-linear characteristic of the output audio signal.

Thus, a method and apparatus capable of addressing the problems of the digital amplifier, which are a monotonous tone, a decrease in the SNR, and non-linearity, is required.

SUMMARY

The exemplary embodiments provide a method of outputting an audio signal and an audio signal output apparatus using the method to improve sound quality.

According to an aspect of the exemplary embodiments, there is provided an audio signal output apparatus including a modulation signal generator for generating a first modulation signal by pulse-modulating an input audio signal of one channel by using a first carrier signal or a first sampling clock, which has a first frequency; a vacuum tube filter unit comprising a vacuum tube and for generating a vacuum tube signal by allowing the first modulation signal to pass through the vacuum tube; a frequency modulation unit for generating a second modulation signal by pulse-modulating the vacuum tube signal; and a power switching amplifier for outputting an amplification signal corresponding to the second modulation signal.

The frequency modulation unit may generate the second modulation signal by pulse-modulating the vacuum tube signal using a second carrier signal or a second sampling clock, which has a second frequency equal to or greater than the first frequency, and may output the second modulation signal to the power switching amplifier.

The vacuum tube may include a filter for filtering a signal having a predetermined frequency band.

The vacuum tube filter unit may generate the vacuum tube signal by filtering a signal component having the first frequency from the first modulation signal, and by adding harmonic components occurring in the vacuum tube to the first modulation signal.

The vacuum tube filter unit may include a low pass filter (LPF) for filtering a signal component having the first frequency, the low pass filter having a predetermined gain value; and a filter for generating the vacuum tube signal by adding second harmonic components to an output signal from the LPF.

The audio signal output apparatus may further include a negative feedback gain controller configured to compare the amplification signal and the first modulation signal for adjusting at least one of a delay value of the amplification signal and a gain value of the amplification signal.

The negative feedback gain controller may include a feedback loop for feeding back and outputting the amplification signal; and an adder for subtracting an output signal of the feedback loop from the first modulation signal.

The audio signal output apparatus may further include a mixing unit for outputting an adjusted signal to the frequency modulation unit by mixing the vacuum tube signal of the one channel with a vacuum tube signal of another channel.

The mixing unit may adjust at least one of an audio depth value, a tone sensitivity, and a crosstalk of the vacuum tube signal by mixing the vacuum tube signal of the one channel with the vacuum tube signal of the other channel according to a predetermined ratio.

The modulation signal generator may include a pulse width modulator for comparing the first carrier signal and the input audio signal, and according to a comparing result, generating a PWM signal as the first modulation signal, wherein the PWM signal corresponds to the input audio signal.

The frequency modulation unit may include a sigma delta modulation unit for outputting the second modulation signal by performing sigma delta modulation on the vacuum tube signal using the second sampling clock having the second frequency.

According to another aspect of the exemplary embodiments, there is provided a method of outputting an audio signal, the method including the operations of generating a first modulation signal by pulse-modulating an input audio signal of one channel by using a first carrier signal or a first sampling clock, which has a first frequency; generating a vacuum tube signal by allowing the first modulation signal to pass through a vacuum tube; generating a second modulation signal by pulse-modulating the vacuum tube signal; and outputting an amplification signal corresponding to the second modulation signal.

BRIEF DESCRIPTION OF THE DRAWINGS

The above and other features and advantages of the exemplary embodiments will become more apparent by describing in detail exemplary embodiments thereof with reference to the attached drawings in which.

DETAILED DESCRIPTION

Hereinafter, the inventive concept will be described in detail by explaining exemplary embodiments thereof with reference to the attached drawings. Examples of an analog amplifier include a class-A amplifier, a class-B amplifier, and a class-AB amplifier. The analog amplifier has excellent linearity and good tone but its power utilization efficiency is significantly lower than that of a digital amplifier. Also, due to the low power utilization efficiency, the analog amplifier has a heat emission problem, so that the analog amplifier has inferior aging characteristics. In addition, due to the low power utilization efficiency, inner devices of the analog amplifier have to be enlarged to generate a high output. Thus, the size of the analog amplifier is increased. However, the analog amplifier has excellent linearity of an output audio signal and realizes a rich tone by using a vacuum tube.

Hereinafter, detailed descriptions will be provided with respect to a method of outputting an audio signal and an audio signal output apparatus using the method which may increase linearity of an audio signal, may realize a rich tone, and may eliminate the disadvantages of the analog amplifier by embodying a digital amplifier by using a vacuum tube.

Figure 1A:
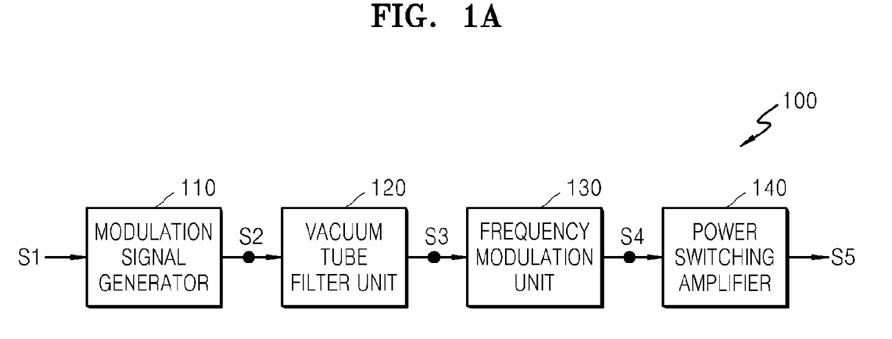
FIG. 1A is a block diagram of an audio signal output apparatus according to an exemplary embodiment.
Figure 1B:
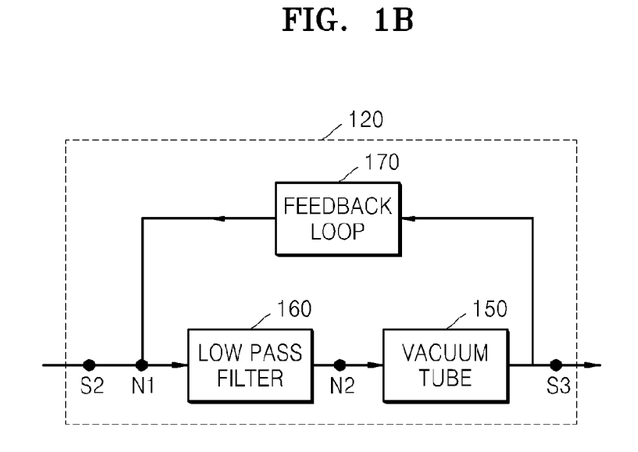
FIG. 1B is a block diagram of a vacuum tube filter unit according to an aspect of an exemplary embodiment.

FIG. 1A is a block diagram of an audio signal output apparatus 100 according to an exemplary embodiment. FIG. 1B is a block diagram illustrating a vacuum tube filter unit 120 in detail.

Referring to FIG. 1A, the audio signal output apparatus 100 includes a modulation signal generator 110, the vacuum tube filter unit 120, a frequency modulation unit 130, and a power switching amplifier 140.

The modulation signal generator 110 generates a first modulation signal S2 by pulse-modulating an input audio signal S1 of one channel by using a first carrier signal or a first sampling clock, which has a predetermined frequency. Hereinafter, a frequency of the first carrier signal or the first sampling clock is referred to as a "first frequency".

In more detail, the modulation signal generator 110 may include a pulse width modulator (PWM) (not shown) or a pulse density modulator (PDM) (not shown), which receives the input audio signal S1 corresponding to the one channel and modulates the input audio signal S1 into a pulse signal.

For example, if the modulation signal generator 110 includes a PWM, the modulation signal generator 110 generates a PWM signal by performing pulse width modulation on the input audio signal S1.

In more detail, the PWM compares the first carrier signal, which is a carrier signal having the first frequency, with the input audio signal S1 that is an analog signal. According to a comparison result, the PWM generates the PWM signal as the first modulation signal S2, wherein the PWM signal corresponds to the input audio signal S1. For example, the PWM may compare a signal level of the first carrier signal with a signal level of the input audio signal S1, and then may generate the first modulation signal S2 at a logic high level in a period where the signal level of the input audio signal S1 is higher than the signal level of the first carrier signal, and may generate the first modulation signal S2 at a logic low level in a period where the signal level of the input audio signal S1 is lower than the signal level of the first carrier signal.

In another embodiment, if the modulation signal generator 110 includes a PDM, the modulation signal generator 110 performs pulse density modulation on the input audio signal S1 and then generates a PDM signal as the first modulation signal S2 by using the first sampling clock, which is a sampling clock having the first frequency. For example, the PDM performs the pulse density modulation according to the sampling clock having the predetermined frequency.

The vacuum tube filter unit 120 generates a vacuum tube signal S3 by allowing the first modulation signal S2 to pass through a vacuum tube. Also, after passing through the vacuum tube filter unit 120, the first modulation signal S2, which is a pulse signal, is converted into the vacuum tube signal S3, which is an analog signal. The vacuum tube included in the vacuum tube filter unit 120 will now be described with reference to FIG. 1B.

In more detail, the vacuum tube filter unit 120 generates the vacuum tube signal S3 by filtering a signal component having a first frequency from the first modulation signal S2 and by adding harmonic components occurring in the vacuum tube to the first modulation signal S2. The harmonic components occurring in the vacuum tube include second harmonic components having a frequency that is an even number multiple of the frequency of the input audio signal S1, and the second harmonic components make sound deep and rich by reinforcing the input audio signal S1, which is a basic sound. The vacuum tube signal S3 that is generated by passing through the vacuum tube filter unit 120 will be described below with reference to FIG. 8A and FIG. 8B.

FIG. 1B illustrates the vacuum tube filter unit 120 in detail.

In more detail, referring to FIG. 1B, the vacuum tube filter unit 120 may include a vacuum tube 150. Also, the vacuum tube 150 may output a signal by amplifying or modulating an input signal in a vacuum space. That is, if the vacuum tube 150 includes a filter having a predetermined gain value, the vacuum tube 150 may output the signal by amplifying the input signal. If the vacuum tube 150 includes a filter which does not gain value, the vacuum tube 150 may output the signal by filtering only a signal having a predetermined band frequency from the input signal without amplifying the input signal.

Referring to FIG. 1B, the vacuum tube filter unit 120 may further include a feedback loop 170. By using the feedback loop 170, the vacuum tube filter unit 120 may correct a signal delay occurring when the first modulation signal S2 passes through the vacuum tube 150. For example, when the first modulation signal S2 corresponding to the input audio signal S1 passes through the vacuum tube 150, a predetermined delay time may occur. Thus, the vacuum tube filter unit 120 may synchronize a rising edge or a falling edge of the first modulation signal S2 before passing through the vacuum tube 150 with a rising edge or a falling edge of the vacuum tube signal S3 that is generated by passing through the vacuum tube 150.

Also, the vacuum tube 150 may include a filter such as a vacuum tube band rejection filter for filtering a predetermined frequency band signal. In this case, the vacuum tube 150 may filter signal components other than a frequency period of an audio signal of the first modulation signal S2 to be output target. Accordingly, when the first modulation signal S2 passes through the vacuum tube 150, the signal components other than an audio signal component to be output target may be removed.

Also, referring to FIG. 1B, the vacuum tube filter unit 120 may further include a low pass filter (LPF) 160. In more detail, the LPF 160 may have a predetermined gain value and may filter a signal having a first frequency component included in the first modulation signal S2. For example, in general, an audio signal such as music or a voice to be output has a low frequency band. Thus, the LPF 160 filters signal components exceeding an uppermost limit of a frequency band of the input audio signal S1 to be output.

Here, the predetermined gain value may be a value to be set by a user or a manufacturer of the audio signal output apparatus 100. Accordingly, the LPF 160 may allow the first modulation signal S2 to be filtered and output while having the predetermined gain value.

An output terminal of the feedback loop 170 may be connected to a first node N1 which is an input terminal of the LPF 160 or a second node N2 which is input terminal of the vacuum tube 150.

The frequency modulation unit 130 generates a second modulation signal S4 by pulse-modulating the vacuum tube signal S3. In more detail, the frequency modulation unit 130 performs a modulation operation such as pulse density modulation or pulse width modulation so as to modulate an input signal into a pulse signal. That is, the frequency modulation unit 130 converts the vacuum tube signal S3, which is an analog signal, into the second modulation signal S4, which is a pulse signal capable of driving the power switching amplifier 140.

In more detail, the frequency modulation unit 130 generates the second modulation signal S4 by pulse-modulating the vacuum tube signal S3 using a second carrier signal or a second sampling clock, which has a second frequency equal to or greater than the first frequency.

Also, sigma delta modulation (SDM) may be used as the pulse density modulation. Thus, the frequency modulation unit 130 may include an SDM unit (not shown).

If the frequency modulation unit 130 includes the SDM unit, the frequency modulation unit 130 generates the second modulation signal S4 by performing sigma delta modulation on the vacuum tube signal S3 by using the second sampling clock having the second frequency equal to or greater than the first frequency. The second sampling clock may be generated by an oscillator (not shown) included in the SDM unit, and a sampling rate according to the second sampling clock decides one pulse period in the second modulation signal S4.

The power switching amplifier 140 includes at least one switching device (not shown) that is turned on or turned off in response to the second modulation signal S4 output from the frequency modulation unit 130. By using the switching device, the power switching amplifier 140 generates an amplified audio signal corresponding to the input audio signal S1. Hereinafter, the audio signal generated by the power switching amplifier 140 is referred to as an "amplification signal S5". Also, the amplification performed by the power switching amplifier 140 is referred to as a switching amplification operation.

When the switching amplification operation is performed, a delay of a rising time and a falling time of a driving signal for performing the switching amplification operation, or switching noise due to a power ripple or a switching loss may occur. Also, power noise may occur with respect to an alternating supply between power having a high voltage level and power having a low voltage level. The switching noise or the power noise decreases a signal-to-noise ratio (SNR) of the audio signal output apparatus 100. The decrease in the SNR causes a decrease in sound quality of an audio signal output from a class-D amplifier.

Here, in order to increase the SNR of the power switching amplifier 140, it is necessary to drive the power switching amplifier 140 at a high speed. As the power switching amplifier 140 is driven at a high speed, the switching noise is decreased so that the SNR is increased. In order to drive the power switching amplifier 140 at a high speed, a frequency of the second modulation signal S4 has to be high and has to be set as a value optimized to the switching amplification operation.

Thus, according to the present embodiment, the second frequency, which is a frequency of the second carrier signal or the second sampling clock to generate the second modulation signal S4, is set to be equal to or greater than the first frequency. Accordingly, it is possible to drive the power switching amplifier 140 at a high speed and to increase the SNR of the audio signal output apparatus 100. Also, the second frequency may be an operational frequency to operate the power switching amplifier 140.

As described above, according to the present embodiment, the first modulation signal S2 that is pulse-modulated passes through the vacuum tube filter unit 120 so that an audio signal having rich tone may be output. Also, by performing the switching amplification operation at a high speed on the vacuum tube signal S3 that is output by passing through the vacuum tube filter unit 120, the switching noise of the amplification signal S5 may be decreased and the SNR of the amplification signal S5 may be increased.

Figure 2A:
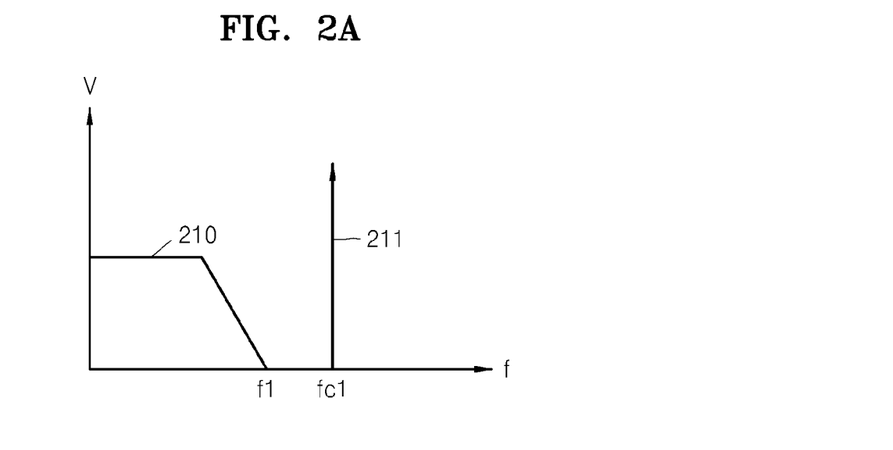
FIG. 2A illustrates a frequency characteristic of a first modulation signal output from the modulation signal generator.
Figure 2B:
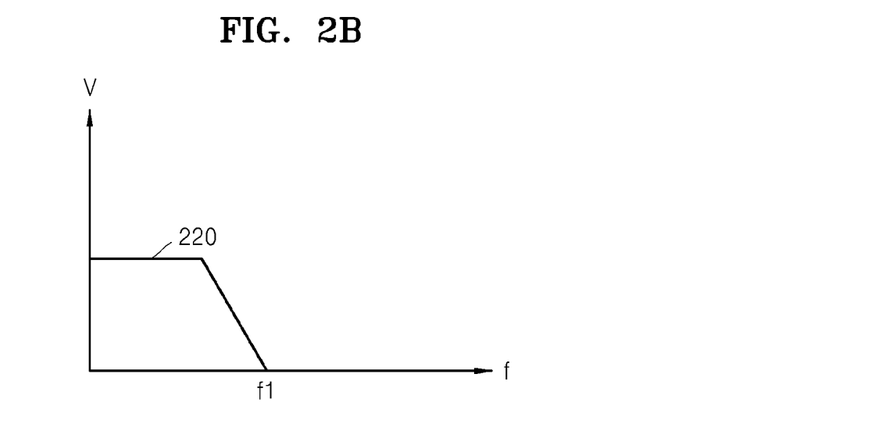
FIG. 2B illustrates a frequency characteristic of a vacuum tube signal that is output from a vacuum tube filter unit.
Figure 2C:
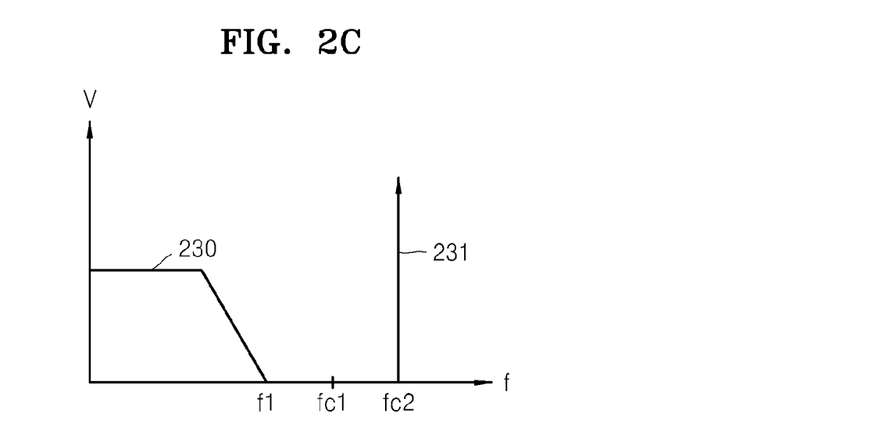
FIG. 2C illustrates a frequency characteristic of a second modulation signal that is output from a frequency modulation unit.

FIGS. 2A-2C illustrate frequency characteristics of audio signals input and output from the audio signal output apparatus 100 of FIG. 1.

FIG. 2A is a graph illustrating a frequency characteristic of the first modulation signal S2 output from the modulation signal generator 110. An X-axis indicates frequency and a Y-axis indicates magnitude of the first modulation signal S2.

Referring to FIG. 2A, the first modulation signal S2 includes an audio signal component 210 and a signal component 211, wherein the audio signal component 210 corresponds to the input audio signal 51 to be output, and the signal component 211 corresponds to the first carrier signal or the first sampling clock, which is used to generate the first modulation signal S2. The audio signal component 210 to be output has a frequency band equal to or less than a predetermined frequency f1. Also, the signal component 211 has the first frequency fc1. In general, a frequency of the first carrier signal or the first sampling clock is greater than an uppermost value of the audio signal component 210 to be output.

FIG. 2B is a graph illustrating the frequency characteristic of the vacuum tube signal S3 that is output from the vacuum tube filter unit 120. An X-axis indicates frequency and a Y-axis indicates magnitude of the vacuum tube signal S3.

The vacuum tube filter unit 120 filters a predetermined band signal and then outputs the vacuum tube signal S3 that is converted into an analog signal. Thus, when the first modulation signal S2 passes through the vacuum tube filter unit 120, the signal component 211 corresponding to the first carrier signal or the first sampling clock is removed, and the vacuum tube signal S3 including only the audio signal component 210 to be output is output.

FIG. 2C is a graph illustrating the frequency characteristic of the second modulation signal S4 that is output from the frequency modulation unit 130. An X-axis indicates frequency and a Y-axis indicates magnitude of the second modulation signal S4.

Referring to FIG. 2C, the second modulation signal S4 includes an audio signal component 230 to be output, and a signal component 231 that corresponds to the second carrier signal or the second sampling clock, which is used to generate the second modulation signal S4. The audio signal component 230 to be output has a frequency band equal to or less than a predetermined frequency f1, and the signal component 231 has the second frequency fc2. In the present embodiment, the second frequency fc2 is greater than the first frequency fc1.

Figure 3:
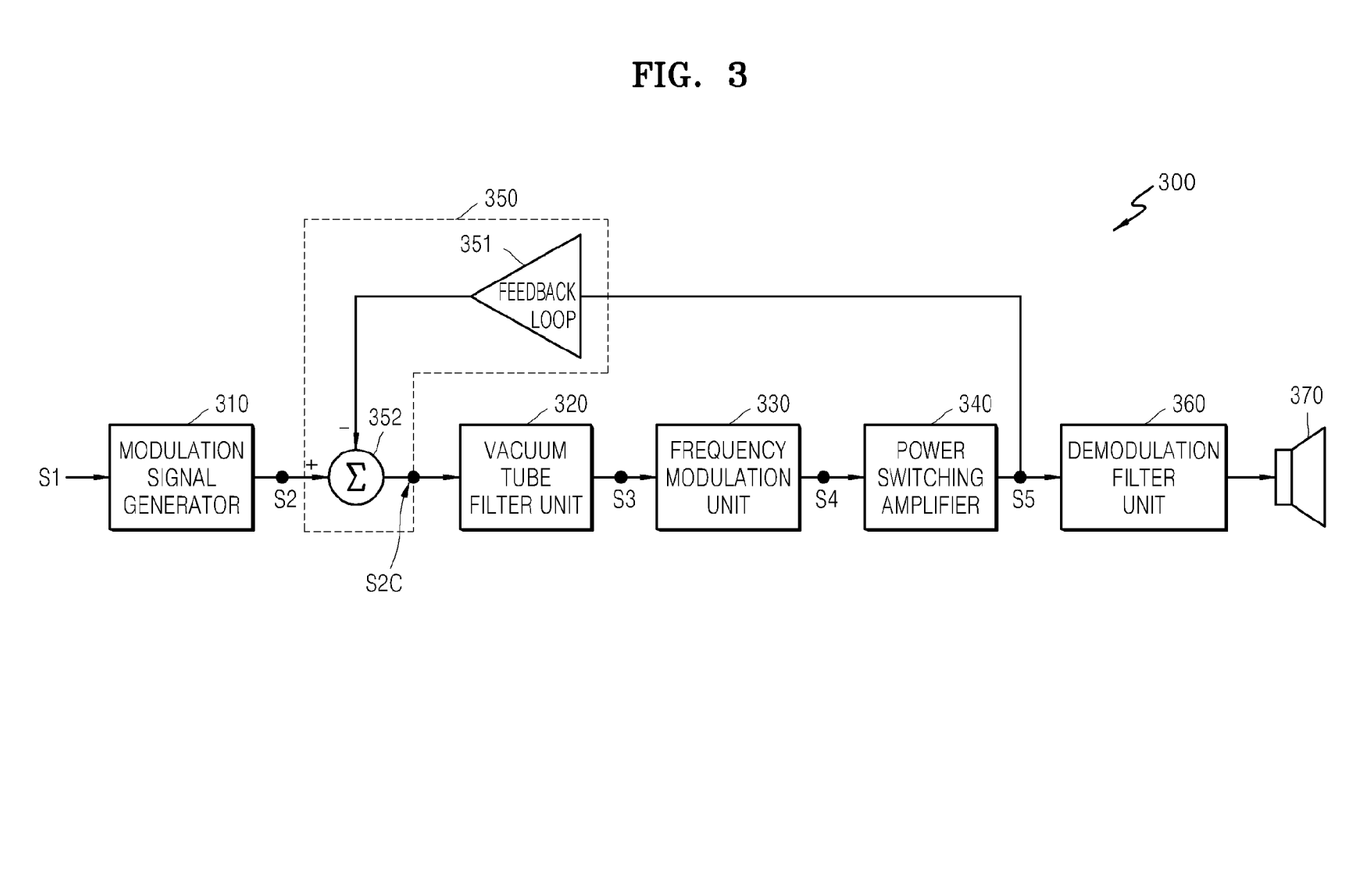
FIG. 3 is a diagram of an audio signal output apparatus according to another exemplary embodiment.

FIG. 3 is a diagram of an audio signal output apparatus 300 according to another exemplary embodiment.

A modulation signal generator 310, a vacuum tube filter unit 320, a frequency modulation unit 330, and a power switching amplifier 340 of the audio signal output apparatus 100 of FIG. 3 correspond to the modulation signal generator 110, the vacuum tube filter unit 120, the frequency modulation unit 130, and the power switching amplifier 140 of the audio signal output apparatus 100 of FIG. 1, respectively. Thus, detailed descriptions that are the same as those with reference to FIG. 1 are omitted.

Referring to FIG. 3, compared to the audio signal output apparatus 100 of FIG. 1, the audio signal output apparatus 300 further includes a negative feedback gain controller 350. Also, compared to the audio signal output apparatus 100 of FIG. 1, the audio signal output apparatus 300 may further include at least one of a demodulation filter unit 360 and a speaker unit 370.

The negative feedback gain controller 350 compares the amplification signal S5 and the first modulation signal S2 for adjusting at least one of a delay value of the amplification signal and a gain value of the amplification signal.

In more detail, the negative feedback gain controller 350 compares an amplification signal S5 and a first modulation signal S2, and based on a comparison result of a phase and/or magnitude difference between the amplification signal S5 and the first modulation signal S2, the negative feedback gain controller 350 controls at least one of a delay value corresponding to the phase difference and a gain value corresponding to the magnitude difference of the amplification signal S5 to be adjusted and then output.

In more detail, the negative feedback gain controller 350 subtracts the amplification signal S5, which is output from the power switching amplifier 340, from the first modulation signal S2, and inputs the subtracted first modulation signal S2 to the vacuum tube filter unit 320. Accordingly, the gain value of the amplification signal S5, which is output to the power switching amplifier 340, may approach a target gain value of the audio signal output apparatus 300.

For example, the negative feedback gain controller 350 may include a feedback loop 351 and an adder 352.

The feedback loop 351 feeds back and outputs the amplification signal S5 to an output terminal of the modulation signal generator 310.

The adder 352 subtracts the amplification signal S5, which is output from the feedback loop 351, from the first modulation signal S2, and then outputs a signal. The signal output from the adder 352 is referred to as a "first corrected modulation signal S2C", and the first corrected modulation signal S2C is a signal obtained by adjusting a gain value or a delay value of the first modulation signal S2 in consideration of the gain value and a phase of the amplification signal S5.

The amplification signal S5 output from the power switching amplifier 340 has a pulse signal form. Also, as a second frequency that is an operational frequency of the power switching amplifier 340 is increased and the amplitude of the amplification signal S5 is increased, a high level of Electronic Magnetic Interference (EMI) may occur in the amplification signal S5 output from the power switching amplifier 340.

The demodulation filter unit 360 demodulates the amplification signal S5 having the pulse signal form into an analog signal. Also, the demodulation filter unit 360 may filter an EMI component occurring in the amplification signal S5.

The demodulation filter unit 360 may include a LPF (not shown) for demodulating the amplification signal S5 into an analog signal and outputting a signal.

The speaker unit 370 converts the signal output from the demodulation filter unit 360 into a physical vibration signal that is acoustically-recognizable to a user, and then outputs a signal.

Figure 4:
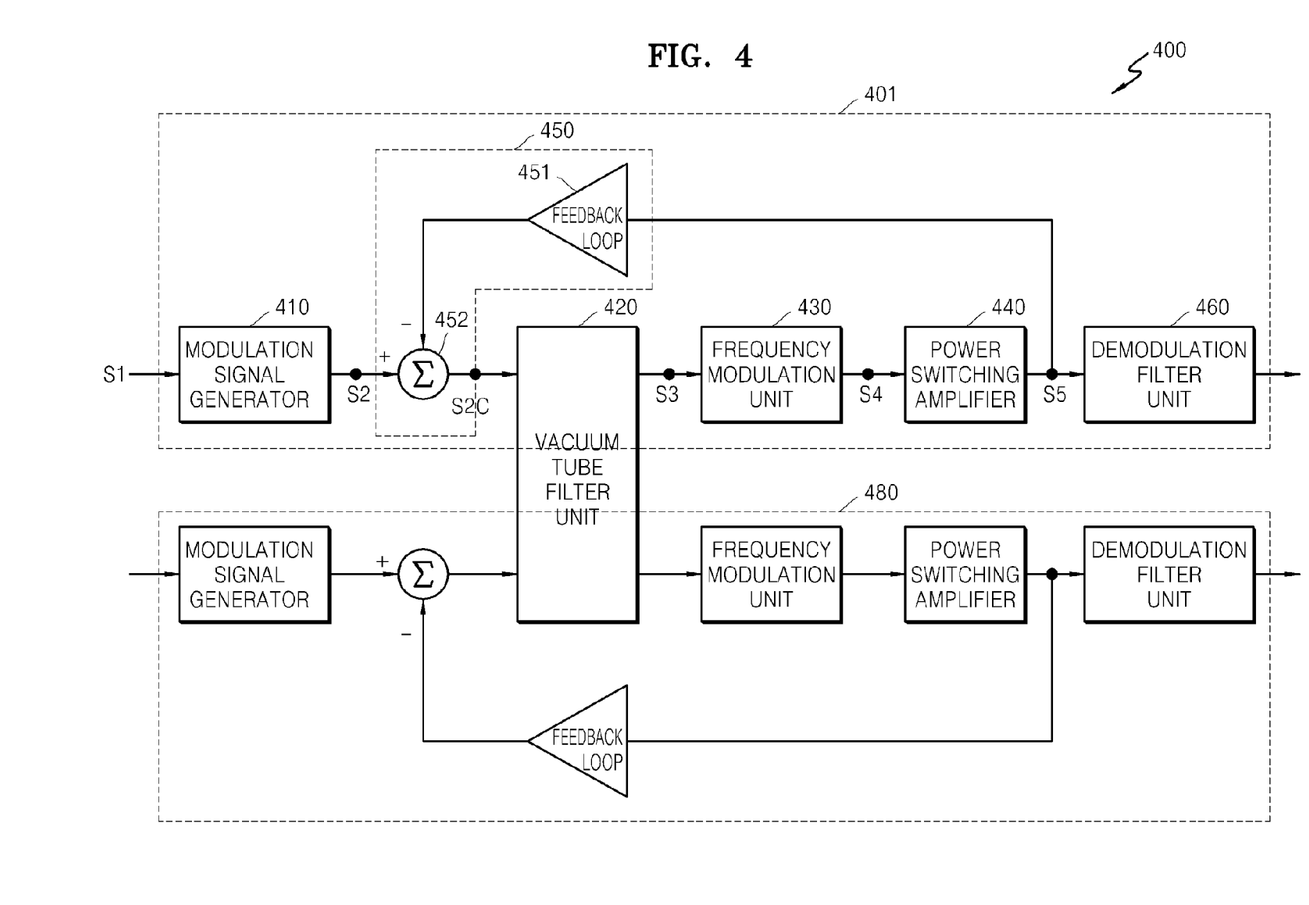
FIG. 4 is a diagram of an audio signal output apparatus according to another exemplary embodiment.

FIG. 4 is a diagram of an audio signal output apparatus 400 according to another exemplary embodiment.

Referring to FIG. 4, the audio signal output apparatus 400 may include a plurality of audio signal output apparatuses for one or more channels. In the case of FIG. 4, the audio signal output apparatus 400 includes first and second audio signal output apparatuses 401 and 480 for two channels, respectively. For example, the first audio signal output apparatus 401 outputs an R-channel audio signal corresponding to a right channel, and the second audio signal output apparatus 480 outputs an L-channel audio signal corresponding to a left channel.

The first audio signal output apparatus 401 or the second audio signal output apparatus 480 corresponds to the audio signal output apparatuses 100 or 300 of FIG. 1 or 3. That is, a modulation signal generator 410, a vacuum tube filter unit 420, a frequency modulation unit 430, a power switching amplifier 440, a negative feedback gain controller 450, and a demodulation filter unit 460 correspond to the modulation signal generator 310, the vacuum tube filter unit 320, the frequency modulation unit 330, the power switching amplifier 340, the negative feedback gain controller 350, and the demodulation filter unit 360 of FIG. 3, respectively. Thus, detailed descriptions that are the same as those with reference to FIGS. 1 and 3 are omitted.

In more detail, the negative feedback gain controller 450 includes a feedback loop 451 and an adder 452. The feedback loop 451 and the adder 452 of FIG. 4 correspond to the feedback loop 351 and the adder 352 of FIG. 3.

In FIG. 4, the vacuum tube filter unit 420 may be shared and used between the first and second audio signal output apparatuses 401 and 480 included in the audio signal output apparatus 400. Alternatively, the vacuum tube filter unit 420 may be separately arranged in each of the first and second audio signal output apparatuses 401 and 480. Referring to the case of FIG. 4, the vacuum tube filter unit 420 is shared between the first and second audio signal output apparatuses 401 and 480.

Figure 5:
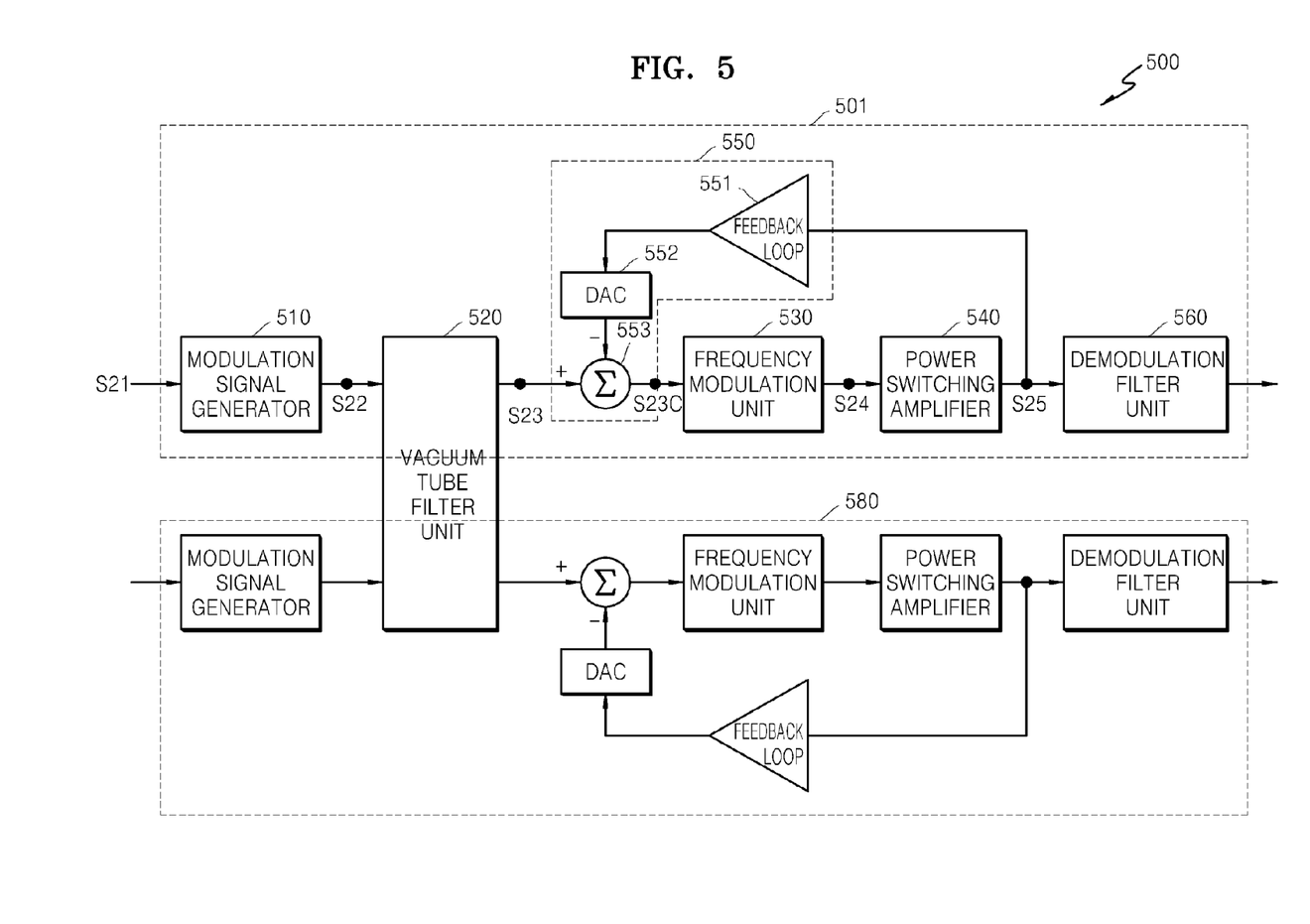
FIG. 5 is a diagram of an audio signal output apparatus according to another exemplary embodiment.

FIG. 5 is a diagram of an audio signal output apparatus 500 according to another exemplary embodiment.

Audio signal output apparatuses 501 and 580 of the audio signal output apparatus 500 of FIG. 5 correspond to the first and second audio signal output apparatuses 401 and 480 of the audio signal output apparatus 400 of FIG. 4, respectively. Thus, detailed descriptions that are the same as those with reference to FIG. 4 are omitted. Also, a modulation signal generator 510, a vacuum tube filter unit 520, a frequency modulation unit 530, a power switching amplifier 540, a negative feedback gain controller 550, and a demodulation filter unit 560 correspond to the modulation signal generator 310, the vacuum tube filter unit 320, the frequency modulation unit 330, the power switching amplifier 340, the negative feedback gain controller 350, and the demodulation filter unit 360 of FIG. 3, respectively. Thus, detailed descriptions that are the same as those with reference to FIGS. 1 and 3 are omitted.

The negative feedback gain controller 550 in the audio signal output apparatus 500 is different from the negative feedback gain controller 350 of the audio signal output apparatus 300 of FIG. 3 in terms of their configurations and detailed cooperative relationships.

The negative feedback gain controller 550 compares a vacuum tube signal S23 output from the vacuum tube filter unit 520 with a signal sent back by the power switching amplifier 540, and according to a comparison result, the negative feedback gain controller 550 controls a delay value or a gain value of an amplification signal S25 to be adjusted and output.

In more detail, the negative feedback gain controller 550 includes a feedback loop 551 and an adder 553. The feedback loop 551 and the adder 553 of FIG. 5 correspond to the feedback loop 351 and the adder 352 of FIG. 3.

In more detail, the feedback loop 551 feeds back the amplification signal S25, which is output from the power switching amplifier 540, and outputs a signal to an output terminal of the vacuum tube filter unit 520.

The adder 553 generates a corrected vacuum tube signal S23C by subtracting the signal, which is output from the feedback loop 551, from the vacuum tube signal S23. The signal output from the feedback loop 551 includes both phase information and gain information of the amplification signal S25 output from the power switching amplifier 540, so that the signal output from the feedback loop 551 may be subtracted from the vacuum tube signal S23. When the signal output from the feedback loop 551 is subtracted from the vacuum tube signal S23 and then the subtracted signal by the adder 553 is input to the frequency modulation unit 530, the gain value of the amplification signal S25 may be further exactly adjusted according to a target gain value. Afterwards, the adder 553 transmits the corrected vacuum tube signal S23C to the frequency modulation unit 530.

The negative feedback gain controller 550 may further include a digital-to-analog converter 552.

The digital-to-analog converter 552 converts the amplification signal S25 into an analog signal. The amplification signal S25 has a pulse signal form, and the vacuum tube signal S23 output from the vacuum tube filter unit 520 has an analog signal form. Thus, by converting the amplification signal S25 into an analog signal that is the same form as the vacuum tube signal S23, the amplification signal S25 and the vacuum tube signal S23 may be easily compared. Thus, the digital-to-analog converter 552 converts the amplification signal S25 so that the amplification signal S25 that was sent back has the same analog signal form as the vacuum tube signal S23.

If the negative feedback gain controller 550 includes the digital-to-analog converter 552, the adder 553 generates the corrected vacuum tube signal S23C by subtracting a signal, which is output from the digital-to-analog converter 552, from the vacuum tube signal S23. The corrected vacuum tube signal S23C is input to the frequency modulation unit 530.

The frequency modulation unit 530 receives the corrected vacuum tube signal S23C and then generates a second modulation signal S24 corresponding to the corrected vacuum tube signal S23C.

Figure 6:
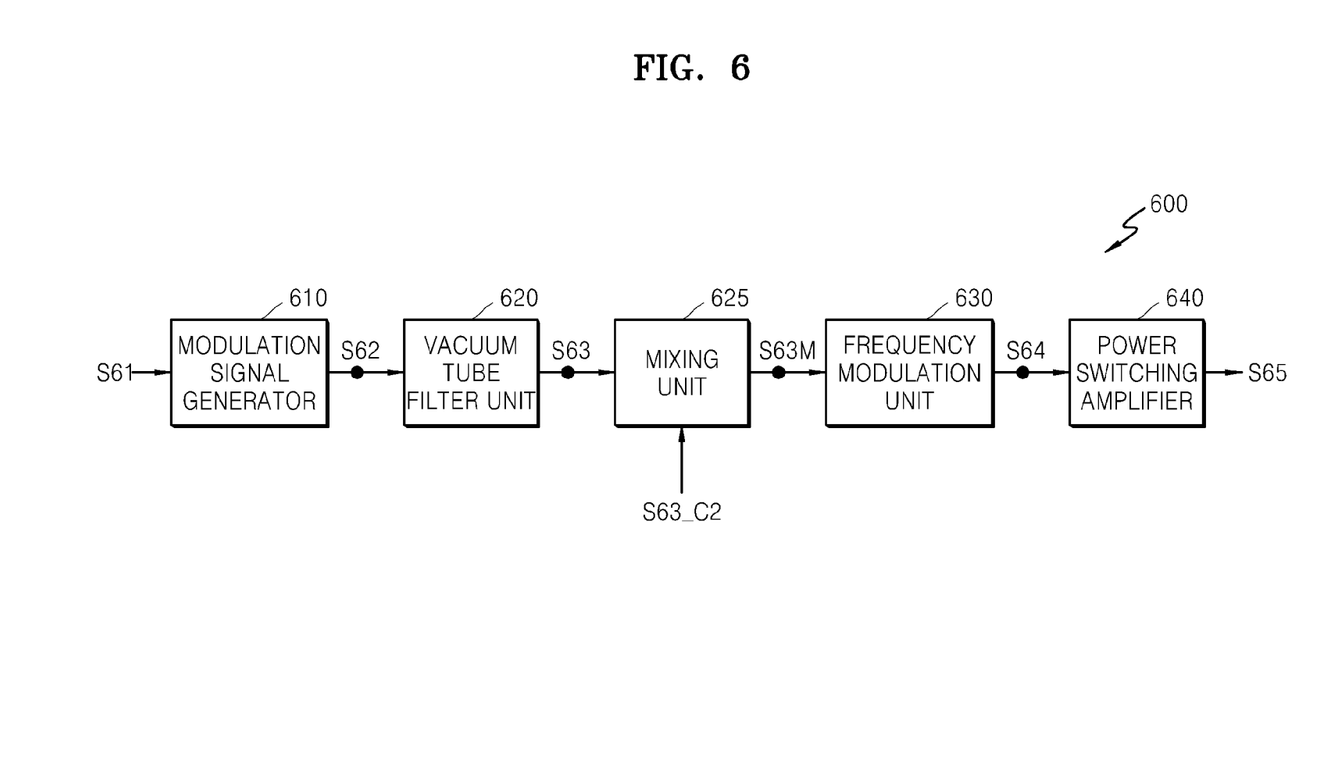
FIG. 6 is a diagram of an audio signal output apparatus according to another exemplary embodiment.

FIG. 6 is a diagram of an audio signal output apparatus 600 according to another embodiment.

A modulation signal generator 610, a vacuum tube filter unit 620, a frequency modulation unit 630, and a power switching amplifier 640 of the audio signal output apparatus 600 of FIG. 6 correspond to the modulation signal generator 110, the vacuum tube filter unit 120, the frequency modulation unit 130, and the power switching amplifier 140 of the audio signal output apparatus 100 of FIG. 1, respectively. Thus, detailed descriptions that are the same as those with reference to FIG. 1 are omitted.

Referring to FIG. 6, compared to the audio signal output apparatus 100 of FIG. 1, the audio signal output apparatus 600 may further include a mixing unit 625. The audio signal output apparatus 600 outputs an audio signal corresponding to one channel.

The mixing unit 625 is connected to an output terminal of the vacuum tube filter unit 620. The mixing unit 625 generates a mixing signal S63M by mixing a vacuum tube signal S63 output from the vacuum tube filter unit 620 with a vacuum tube signal S63_C2 output from an audio signal output apparatus (not shown) corresponding to another channel. The mixing signal S63M is input to the frequency modulation unit 630.

In more detail, the mixing unit 625 mixes the vacuum tube signal S63 of the one channel with the vacuum tube signal S63_C2 of the other channel according to a predetermined mixing ratio, thereby adjusting at least one of an audio depth value, a tone sensitivity, and crosstalk of the vacuum tube signal S63 of the one channel. The predetermined mixing ratio may vary according to a setting in the audio signal output apparatus 600 or a setting that is set by a user.

The frequency modulation unit 630 receives the mixing signal S63M and then generates a second modulation signal S64 corresponding to the mixing signal S63M.

The power switching amplifier 640 outputs an amplification signal S65 by amplifying the second modulation signal S64.

Figure 7:
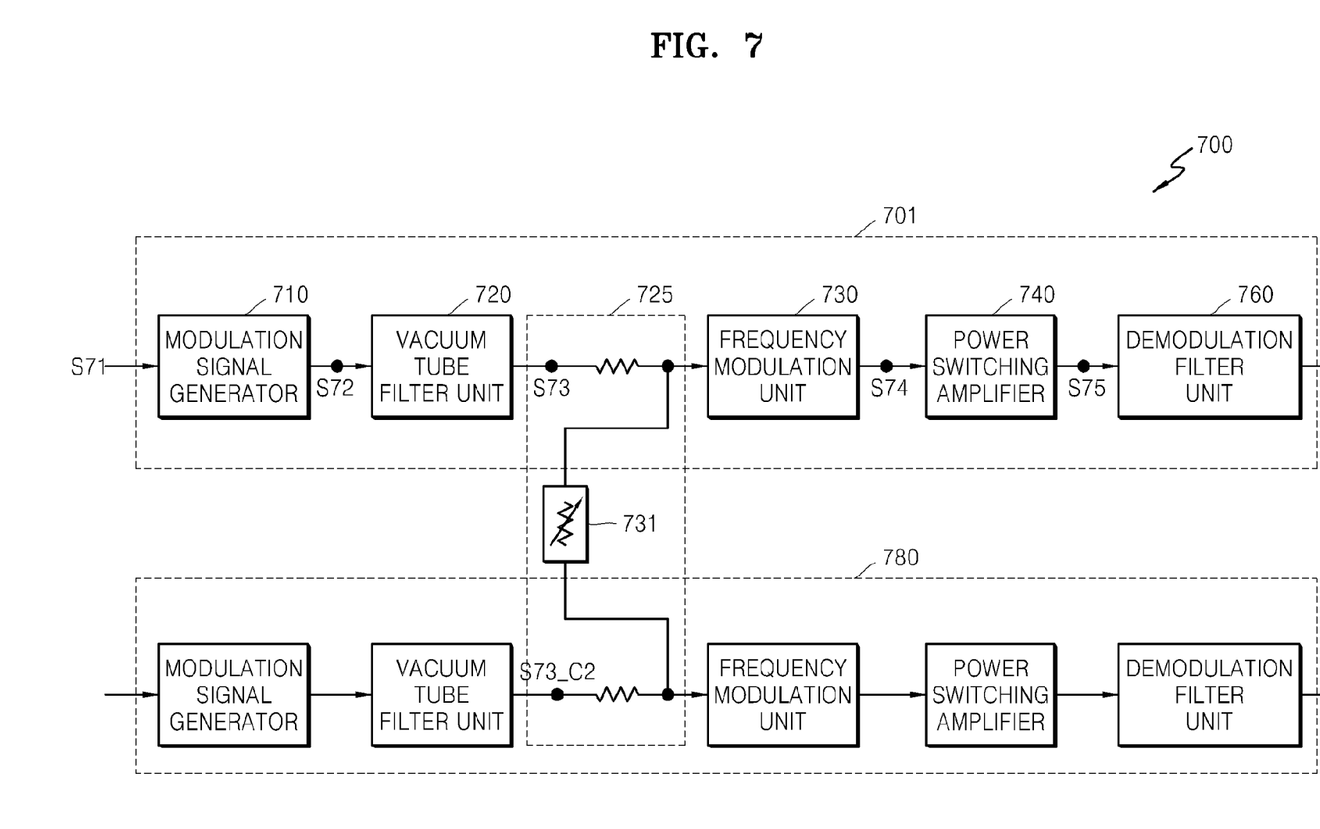
FIG. 7 is a diagram illustrating the audio signal output apparatus of FIG. 6 in detail.

FIG. 7 is a diagram illustrating the audio signal output apparatus 600 of FIG. 6 in detail.

Referring to FIG. 7, similar to the audio signal output apparatuses 400 and 500 of FIGS. 4 and 5, an audio signal output apparatus 700 includes first and second audio signal output apparatuses 701 and 780 for one or more channels. A modulation signal generator 710, a vacuum tube filter unit 720, a mixing unit 725, a frequency modulation unit 730, and a power switching amplifier 740 of the audio signal output apparatus 700 of FIG. 7 correspond to the modulation signal generator 610, the vacuum tube filter unit 620, the mixing unit 625, the frequency modulation unit 630, and the power switching amplifier 640 of FIG. 6, respectively. Thus, detailed descriptions that are the same as those with reference to FIG. 6 are omitted.

For example, the first audio signal output apparatus 701 outputs an R-channel audio signal corresponding to a right channel, and the second audio signal output apparatus 780 outputs an L-channel audio signal corresponding to a left channel.

The mixing unit 725 may include a variable resistor unit 731 for mixing a vacuum tube signal S73 of a first channel with a vacuum tube signal S73_C2 of a second channel according to a predetermined ratio. The predetermined ratio may correspond to a resistance ratio of the variable resistor unit 731. A vacuum tube signal mixed in the variable resistor unit 731 is transmitted to the frequency modulation unit 730. Also, the mixing unit 725 may be shared and used between the first audio signal output apparatus 701 and the second audio signal output apparatus 780.

Figure 8A:
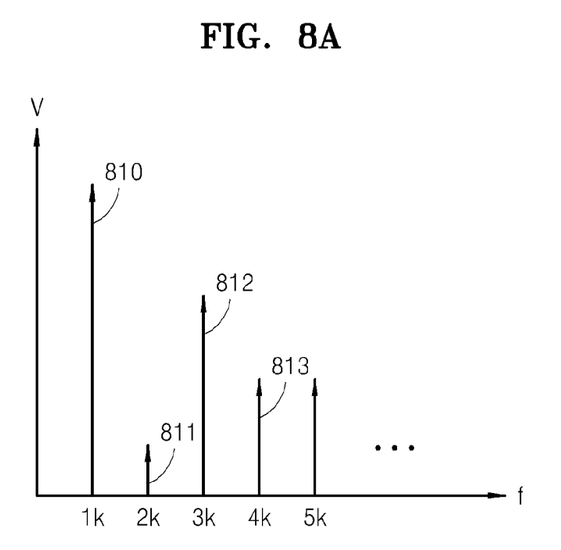
FIG. 8A illustrates an audio signal output from the audio signal output apparatus that performs an amplification operation by using a general digital amplifier.
Figure 8B:
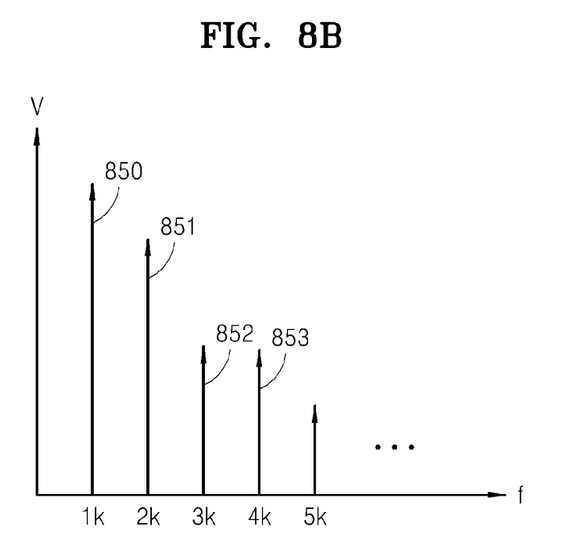
FIG. 8B illustrates an audio signal output from the audio signal output apparatus that performs a digital amplification operation after allowing an input audio signal to pass through a vacuum tube according to the one or more exemplary embodiments.

FIGS. 8A and 8B illustrate an audio signal output from the audio signal output apparatus according to the one or more exemplary embodiments.

FIG. 8A illustrates an audio signal output from an audio signal output apparatus that performs an amplification operation by using a general digital amplifier. In FIG. 8A, an X-axis indicates a frequency value and a Y-axis indicates a voltage value that is an output level of the audio signal.

Referring to FIG. 8A, the audio signal output from the audio signal output apparatus includes a plurality of frequency components 810, 811, 812, and 813 that are illustrated as graphs 810, 811, 812, and 813, respectively. The graph 810 indicates a target audio signal component having a basic frequency 1 k, and the graphs 811 and 813 indicate second harmonic components derived by a digital amplifier. The graph 812 indicates a third harmonic component derived by the digital amplifier. Here, the third harmonic component is a signal component having a frequency that has multiple frequency of the basic frequency 1 k by an odd number.

As described above, the second harmonic components make sound deep and rich by reinforcing the target audio signal that is basic sound. Also, the second harmonic components have a natural acoustic feature, express a delicate change in a tone, and make rich sound that reaches a rear side of a large space.

Compared to the second harmonic components, the third harmonic component has a hard tone and is monotonously recognized as noise. Thus, the third harmonic component causes distortion of the basic sound.

As illustrated in FIG. 8A, the audio signal output apparatus that performs the amplification operation by using a general digital amplifier has the small second harmonic component 811 and the large third harmonic component 812.

Thus, the audio signal output from the audio signal output apparatus has inferior sound quality than the target audio signal.

FIG. 8B illustrates the audio signal output from the audio signal output apparatus according to the one or more exemplary embodiments.

In FIG. 8B, an X-axis indicates a frequency value and a Y-axis indicates a voltage value that is an output level of the audio signal.

Referring to FIG. 8B, the audio signal output from the audio signal output apparatus includes a plurality of frequency components 850, 851, 852, and 853 that are illustrated as graphs 850, 851, 852, and 853, respectively. The graph 850 indicates a target audio signal component having a basic frequency 1 k, and the graphs 851 and 853 indicate second harmonic components derived by a digital amplifier. The graph 852 indicates a third harmonic component derived by the digital amplifier.

The audio signal output apparatus according to the one or more embodiments performs a digital amplification operation after allowing an input audio signal to pass through a vacuum tube, so that the audio signal output apparatus according to the one or more embodiments outputs the audio signal including the target audio signal component having the basic frequency 1 k, and the second harmonic components 851 and 853. Thus, the audio signal output apparatus according to the one or more embodiments may output an audio signal having a rich tone.

Figure 9:
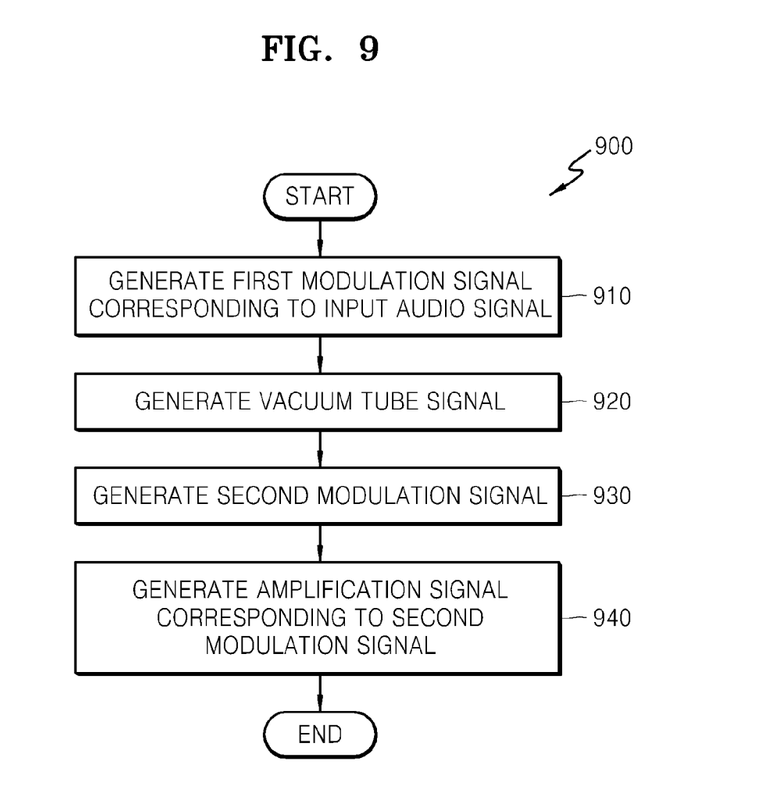
FIG. 9 is a flowchart illustrating a method of outputting an audio signal, according to an exemplary embodiment.

FIG. 9 is a flowchart illustrating a method of outputting an audio signal, according to an exemplary embodiment. An operational configuration of the method of FIG. 9 is the same as the audio signal output apparatus described above with reference to FIGS. 1 through 8. Thus, detailed descriptions that are the same as those with reference to FIGS. 1 through 8 are omitted. Also, the method of FIG. 9 will now be described with reference to the audio signal output apparatus 100 of FIG. 1.

Referring to FIG. 9, the method involves generating the first modulation signal S2 by pulse-modulating the input audio signal 51 of one channel by using a first carrier signal or a first sampling clock, which has a first frequency (operation 910). Operation 910 may be performed by the modulation signal generator 110.

By allowing the first modulation signal S2 generated in operation 910 to pass through a vacuum tube, the vacuum tube signal S3 is generated (operation 920). Operation 920 may be performed by the vacuum tube filter unit 120. In more detail, the vacuum tube signal S3 may be generated by filtering a signal component having a first frequency from the first modulation signal S2 and by adding a harmonic component occurring in the vacuum tube to the first modulation signal S2.

Afterwards, the second modulation signal S4 is generated by pulse-modulating the vacuum tube signal S3 (operation 930). In more detail, the second modulation signal S4 may be generated by pulse-modulating the vacuum tube signal S3 by using a second carrier signal or a second sampling clock, which has a second frequency equal to or greater than the first frequency. Operation 930 may be performed by the frequency modulation unit 130.

The amplification signal S5 corresponding to the second modulation signal S4 generated in operation 930 is generated (operation 940). Operation 940 may be performed by the power switching amplifier 140.

After operation 940, the amplification signal S5 is compared with the first modulation signal S2 or the vacuum tube signal S3, and then according to a comparison result, the first modulation signal S2 or the vacuum tube signal S3 is corrected (not shown operation). This operation may be performed by either the negative feedback gain controller 350, 450, or 550 of the audio signal output apparatuses 300, 400, and 500. Accordingly, in operation 920, the corrected first modulation signal S2 may be received and then the vacuum tube signal S3 corresponding to the corrected first modulation signal S2 may be generated, and in operation 930, the corrected vacuum tube signal S3 may be received and then the second modulation signal S4 corresponding to the corrected vacuum tube signal S3 may be generated.

The method of FIG. 9 may further involve mixing the vacuum tube signal S3 of one channel with a vacuum tube signal of another channel (not shown operation). Accordingly, in operation 930, the second modulation signal S4 may be generated by pulse-modulating a mixed vacuum tube signal.

As described above, the method of outputting an audio signal and the audio signal output apparatus using the method may mix an audio signal with a harmonic component of a vacuum tube and then may output the audio signal. In more detail, the method of outputting an audio signal and the audio signal output apparatus using the method may output the audio signal having a rich tone by amplifying the audio signal that has passed through the vacuum tube. Accordingly, sound quality of the output audio signal may be improved.

Also, the method of outputting an audio signal and the audio signal output apparatus using the method performs the switching amplification operation by using a signal that is modulated into a pulse signal by using a carrier signal or sampling clock having a high frequency. Accordingly, switching noise may be minimized and an SNR may be increased.

The exemplary embodiments can also be embodied as computer-readable codes on a computer-readable recording medium. The computer-readable recording medium is any data storage device that can store data which can be thereafter read by a computer system. Examples of the computer-readable recording medium include read-only memory (ROM), random-access memory (RAM), CD-ROMs, magnetic tapes, floppy disks, optical data storage devices, etc. The computer-readable recording medium can also be distributed over network-coupled computer systems so that the computer-readable code is stored and executed in a distributed fashion.

While the exemplary embodiments have been particularly shown and described with reference to exemplary embodiments thereof, it will be understood by those of ordinary skill in the art that various changes in form and details may be made therein without departing from the spirit and scope of the inventive concept as defined by the following claims.

What is claimed is:

1. An audio signal output apparatus comprising:
a modulation signal generator which generates a first modulation signal by pulse-modulating an input audio signal of one channel by using a first carrier signal or a first sampling clock, which has a first frequency;
a vacuum tube filter unit comprising a vacuum tube which generates a vacuum tube signal by allowing the first modulation signal to pass through the vacuum tube;
a frequency modulation unit which generates a second modulation signal by pulse-modulating the vacuum tube signal;
a power switching amplifier which outputs an amplification signal corresponding to the second modulation signal; and
a mixing unit which outputs an adjusted signal to the frequency modulation unit by mixing the vacuum tube signal of the one channel with a vacuum tube signal of another channel.

2. The audio signal output apparatus of claim 1, wherein the frequency modulation unit generates the second modulation signal by pulse-modulating the vacuum tube signal by using a second carrier signal or a second sampling clock, which has a second frequency equal to or greater than the first frequency, and outputs the second modulation signal to the power switching amplifier.

3. The audio signal output apparatus of claim 1, wherein the vacuum tube comprises a filter which filters a signal having a predetermined frequency band.

4. The audio signal output apparatus of claim 3, wherein the vacuum tube filter unit generates the vacuum tube signal by filtering a signal component having the first frequency from the first modulation signal, and by adding a harmonic component occurring in the vacuum tube to the first modulation signal.

5. The audio signal output apparatus of claim 1, wherein the vacuum tube filter unit comprises:
a low pass filter (LPF) which filters a signal component having the first frequency, the low pass filter having a predetermined gain value; and
a filter which generates the vacuum tube signal by adding a second harmonic component to an output signal from the LPF.

6. The audio signal output apparatus of claim 1, further comprising a negative feedback gain controller which compares the amplification signal and the first modulation signal and adjusts at least one of a delay value of the amplification signal and a gain value of the amplification signal.

7. The audio signal output apparatus of claim 6, wherein the negative feedback gain controller comprises:
a feedback loop which feeds back and outputs the amplification signal; and
an adder which subtracts an output signal of the feedback loop from the first modulation signal.

8. The audio signal output apparatus of claim 1, further comprising a negative feedback gain controller which compares the vacuum tube signal and the amplification signal, and according to a comparing result, controls a delay value or a gain value of the amplification signal to be adjusted and output.

9. The audio signal output apparatus of claim 8, wherein the negative feedback gain controller comprises:
a feedback loop which feeds back and outputs the amplification signal; and
an adder which subtracts an output signal of the feedback loop from the first modulation signal.

10. The audio signal output apparatus of claim 9, wherein the negative feedback gain controller further comprises a digital-to-analog converter that is disposed between the feedback loop and the adder, converts the output signal of the feedback loop into an analog signal, and outputs the analog signal to the adder.

11. The audio signal output apparatus of claim 1, wherein the mixing unit adjusts at least one of an audio depth value, a tone sensitivity, and crosstalk of the vacuum tube signal by mixing the vacuum tube signal of the one channel with the vacuum tube signal of the other channel according to a predetermined ratio, and then outputs the adjusted signal to the frequency modulation unit.

12. The audio signal output apparatus of claim 1, wherein the modulation signal generator comprises a pulse width modulator which compares the first carrier signal and the input audio signal, and which generates a PWM signal as the first modulation signal according to a comparing result.

13. The audio signal output apparatus of claim 2, wherein the frequency modulation unit comprises a sigma delta modulation unit which outputs the second modulation signal by performing sigma delta modulation on the vacuum tube signal using the second sampling clock.

14. A method of outputting an audio signal, the method comprising:
   generating a first modulation signal by pulse-modulating an input audio signal of one channel by using a first carrier signal or a first sampling clock, which has a first frequency;
   generating a vacuum tube signal by allowing the first modulation signal to pass through a vacuum tube;
   generating a second modulation signal by pulse-modulating the vacuum tube signal;
   outputting an amplification signal corresponding to the second modulation signal; and
   mixing the vacuum tube signal of the one channel with a vacuum tube signal of another channel,
   wherein the generating of the second modulation signal comprises generating the second modulation signal by pulse-modulating the mixed vacuum tube signal.

15. The method of claim 14, wherein the generating of the second modulation signal comprises generating the second modulation signal by pulse-modulating the vacuum tube signal using a second carrier signal or a second sampling clock, which has a second frequency equal to or greater than the first frequency.

16. The method of claim 14, wherein the generating of the vacuum tube signal comprises generating the vacuum tube signal by filtering a signal component having the first frequency from the first modulation signal, and by adding a harmonic component occurring in the vacuum tube to the first modulation signal.

17. The method of claim 14, further comprising comparing the amplification signal with the first modulation signal or the vacuum tube signal, and according to a comparing result, correcting at least one of a phase and a magnitude of the first modulation signal or the vacuum tube signal.

18. The method of claim 14, wherein the mixing of the vacuum tube signal comprises adjusting at least one of an audio depth value, a tone sensitivity, and crosstalk of the vacuum tube signal by mixing the vacuum tube signal of the one channel with the vacuum tube signal of the other channel according to a predetermined ratio.

* * * * *